(12) United States Patent
Xiao et al.

(10) Patent No.: US 10,127,955 B2
(45) Date of Patent: Nov. 13, 2018

(54) MEMORY ACTIVATION METHOD AND APPARATUS, AND MEMORY CONTROLLER

(71) Applicant: Huawei Technologies Co., Ltd., Shenzhen, Guangdong (CN)

(72) Inventors: Shihai Xiao, Hangzhou (CN); Wei Yang, Hangzhou (CN); Junfeng Zhao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/607,360

(22) Filed: May 26, 2017

(65) Prior Publication Data
US 2017/0263295 A1    Sep. 14, 2017

Related U.S. Application Data

(63) Continuation of application No. PCT/CN2015/095886, filed on Nov. 28, 2015.

(30) Foreign Application Priority Data

Nov. 28, 2014 (CN) .......................... 2014 1 0707487

(51) Int. Cl.
*G11C 8/10* (2006.01)
*G11C 8/16* (2006.01)
*G06F 3/06* (2006.01)

(52) U.S. Cl.
CPC .............. *G11C 8/16* (2013.01); *G06F 3/0659* (2013.01); *G11C 8/10* (2013.01)

(58) Field of Classification Search
CPC ..................................... G11C 8/10; G11C 8/12
(Continued)

(56) References Cited

U.S. PATENT DOCUMENTS 6,161,208 A * 12/2000 Dutton ................ G06F 11/1008
  711/118
6,226,722 B1 * 5/2001 Shippy ................ G06F 12/0884
  711/168
(Continued)

FOREIGN PATENT DOCUMENTS

CN    1783032 A    6/2006
CN    101788961 A    7/2010
(Continued)

OTHER PUBLICATIONS

Gulur et al.; "Multiple Sub-Row Buffers in DRAM: Unlocking Performance and Energy Improvement Opportunities"; ICS'12; Jun. 25-29, 2012; San Servolo Island, Venice, Italy; 10 pages.
(Continued)

*Primary Examiner* — Michael Tran

(57) ABSTRACT

A first memory access request is obtained, where the first memory access request is used to request to access a first sub-row in a memory. A to-be-scheduled queue of the memory is searched for a second memory access request, where the to-be-scheduled queue of the memory includes multiple memory access requests, the second memory access request is used to request to access a second sub-row in the memory. The first sub-row and the second sub-row are located in a same row in the memory. The first memory access request and the second memory access request are combined to generate a first activation instruction, where the first activation instruction is used to instruct to activate the first sub-row and the second sub-row in the memory. The first activation instruction is sent to the memory.

11 Claims, 12 Drawing Sheets

(58) Field of Classification Search
USPC .................................. 365/230.03, 230.06
See application file for complete search history.

(56) References Cited

U.S. PATENT DOCUMENTS

| | | | |
|---|---|---|---|
| 6,339,822 B1* | 1/2002 | Miller | G06F 9/30149 711/125 |
| 6,618,390 B1* | 9/2003 | Erimli | H04L 49/90 370/395.7 |
| 2003/0038810 A1* | 2/2003 | Emberling | G06T 1/60 345/540 |
| 2003/0067832 A1* | 4/2003 | Emmot | G11C 8/12 365/230.03 |
| 2003/0140284 A1* | 7/2003 | Dettinger | G06F 11/1052 714/48 |
| 2003/0188086 A1* | 10/2003 | Singh | G06F 15/7842 711/104 |
| 2003/0191915 A1* | 10/2003 | Saxena | G06F 1/3225 711/160 |
| 2004/0049630 A1* | 3/2004 | Stark | G11C 15/00 711/108 |
| 2005/0177689 A1* | 8/2005 | Leijten | G06F 13/161 711/149 |
| 2006/0107019 A1 | 5/2006 | Ganfield et al. | |
| 2007/0150666 A1 | 6/2007 | Hwang et al. | |
| 2008/0123450 A1 | 5/2008 | Rao | |
| 2008/0307186 A1* | 12/2008 | Silverstein | H04N 5/772 711/170 |
| 2009/0055580 A1* | 2/2009 | Moscibroda | G06F 13/1642 711/104 |
| 2009/0172339 A1 | 7/2009 | Kobayashi | |
| 2010/0077283 A1* | 3/2010 | Kim | G06F 11/1008 714/805 |
| 2011/0093367 A1* | 4/2011 | Stapleton | G06Q 10/06 705/30 |
| 2012/0257506 A1* | 10/2012 | Bazlamacci | H04L 45/00 370/235 |
| 2012/0314521 A1 | 12/2012 | Bains et al. | |
| 2013/0091112 A1* | 4/2013 | Iyer | G06F 17/30345 707/702 |
| 2013/0151795 A1* | 6/2013 | Lee | G06F 13/18 711/151 |
| 2014/0173170 A1 | 6/2014 | Muralimanohar et al. | |
| 2015/0074155 A1* | 3/2015 | Walter | G06F 12/0269 707/816 |
| 2016/0216912 A1 | 7/2016 | Muralimanohar et al. | |

FOREIGN PATENT DOCUMENTS

| | | |
|---|---|---|
| CN | 101981548 A | 2/2011 |
| CN | 102812518 A | 12/2012 |
| CN | 102999441 A | 3/2013 |
| CN | 103927268 A | 7/2014 |
| EP | 2041750 A2 | 4/2009 |
| JP | H09180450 A | 7/1997 |
| JP | 2009157887 A | 7/2009 |
| WO | 2014178846 A1 | 11/2014 |

OTHER PUBLICATIONS

Cooper-Balis et al.; "Fine-Grained Activation for Power Reduction in DRAM"; IEEE Micro vol. 30, Issue 3; May-Jun. 2010; 14 pages.
Meza et al.; "A Case for Small Row Buffers in Non-Volatile Main Memories"; 2012 IEEE 30th International Conference on Computer Design (ICCD); Sep. 30-Oct. 3, 2012; 2 pages.
Kim et al.; "A Case for Exploiting Subarray-Level Parallelism (SALP) in DRAM"; 2012 29th Annual International Symposium on Computer Architecture (ISCA); Jun. 9-13, 2012; Portland, Oregon, USA; 12 pages.
Li et al.; "A Method of Reducing the Latency of Memory Access"; Computer Engineering; vol. 32, No. 3; Feb. 2006; 3 pages.

* cited by examiner

MEMORY ACTIVATION METHOD AND APPARATUS, AND MEMORY CONTROLLER

CROSS-REFERENCE TO RELATED APPLICATION

This application is a continuation of International Application No. PCT/CN2015/095886, filed on Nov. 28, 2015, which claims priority to Chinese Patent Application No. 201410707487.7, filed on Nov. 28, 2014. Both of the aforementioned applications are hereby incorporated by reference in their entireties.

TECHNICAL FIELD

The present application relates to the computer field, and in particular, to a memory activation method and apparatus.

BACKGROUND

Currently, power consumption of memories takes up 25% to 40% of power consumption of a data center. One memory has a row-column structure, and a cell formed by crossing any row and any column is a storage unit. Therefore, any storage unit is corresponding to one row number and one column number. When a storage unit in a row is to be accessed, the entire row needs to be activated first. When a storage unit whose number is "00" (that is, the storage unit is located at a row 0 and a column 0) is to be accessed, nine storage units located in the row 0 need to be activated first, and power consumption of activation takes up at least 85% of power consumption of the memory. Therefore, the current data center has relatively large power consumption.

To reduce the power consumption of the data center, a method for accessing a memory by using a fine-granularity row is put forward. A main idea of the solution is: only a to-be-accessed storage unit needs to be activated each time during activation, and there is no need to activate all storage units that are located in a same row as the to-be-accessed storage unit. When receiving a row activation instruction, a memory does not activate a row immediately. Instead, when receiving a column activation instruction, the memory determines a to-be-activated storage unit according to a row address in the row activation instruction and a column address in the column activation instruction, and then activates the storage unit. Therefore, the power consumption of the data center is reduced.

However, in the foregoing solution, multiple storage units cannot be activated simultaneously; but instead, each time after a storage unit is activated, the storage unit needs to be precharged, and then an activation operation can be performed on a next storage unit. Therefore, a current memory activation method has a disadvantage of relatively low efficiency.

SUMMARY

Embodiments of the present disclosure provide a memory activation method and apparatus, to overcome a prior-art disadvantage of relatively low efficiency in a memory activation method.

Specific technical solutions provided in the embodiments of the present disclosure are as follows:

According to a first aspect, a memory activation method is provided, including:

obtaining a first memory access request, where the first memory access request is used to request to access a first sub-row in a memory;

searching a to-be-scheduled queue of the memory for a second memory access request, where the to-be-scheduled queue of the memory includes multiple memory access requests, the second memory access request is used to request to access a second sub-row in the memory, and the first sub-row and the second sub-row are located in a same row in the memory;

combining the first memory access request and the second memory access request to generate a first activation instruction, where the first activation instruction is used to instruct to activate the first sub-row and the second sub-row in the memory; and sending the first activation instruction to the memory.

With reference to the first aspect, in a first possible implementation manner, after the searching a to-be-scheduled queue of the memory for a second memory access request, the method further includes:

generating a sub-row selection vector, and sending the sub-row selection vector to the memory; where the sub-row selection vector is used to identify that sub-rows to be activated are the first sub-row and the second sub-row.

According to a second aspect, a memory activation method is provided, including:

receiving a first activation instruction sent by a memory controller, where the first activation instruction is used to instruct to activate a first sub-row and a second sub-row in a memory, and both the first sub-row and the second sub-row are located in a same row in the memory; and activating, according to the first activation instruction, the first sub-row and the second sub-row that are located in the memory.

With reference to the second aspect, in a first possible implementation manner, before the activating, according to the first activation instruction, the first sub-row and the second sub-row that are located in the memory, the method further includes:

receiving a sub-row selection vector sent by the memory controller, where the sub-row selection vector is used to identify that sub-rows to be activated are the first sub-row and the second sub-row; and the activating, according to the first activation instruction, the first sub-row and the second sub-row that are located in the memory specifically includes:

activating, according to the sub-row selection vector in the first activation instruction, the first sub-row and the second sub-row that are located in the memory.

According to a third aspect, a memory controller is provided, including:

a request distribution module, configured to obtain a first memory access request, where the first memory access request is used to request to access a first sub-row in a memory;

a memory scheduler, configured to search a to-be-scheduled queue of the memory for a second memory access request, where the to-be-scheduled queue of the memory includes multiple memory access requests, the second memory access request is used to request to access a second sub-row in the memory, and the first sub-row and the second sub-row are located in a same row in the memory; where the memory scheduler is further configured to combine the first memory access request and the second memory access request to generate a first activation instruction, where the first activation instruction is used to instruct to activate the first sub-row and the second sub-row in the memory; and a command scheduler, configured to send the first activation instruction to the memory.

With reference to the third aspect, in a first possible implementation manner, the memory scheduler is further configured to:

generate a sub-row selection vector, and send the sub-row selection vector to the memory; where the sub-row selection vector is used to identify that sub-rows to be activated are the first sub-row and the second sub-row.

According to a fourth aspect, a memory module is provided, including:

a latch, configured to receive a first activation instruction sent by a memory controller, where the first activation instruction is used to instruct to activate a first sub-row and a second sub-row in a memory, and both the first sub-row and the second sub-row are located in a same row in the memory; and a sub-row selection decoder, configured to activate, according to the first activation instruction obtained from the latch, the first sub-row and the second sub-row that are located in the memory.

With reference to the fourth aspect, in a first possible implementation manner, the latch is further configured to:

receive a sub-row selection vector sent by the memory controller, where the sub-row selection vector is used to identify that sub-rows to be activated are the first sub-row and the second sub-row; and the sub-row selection decoder is specifically configured to:

activate, according to the sub-row selection vector in the first activation instruction, the first sub-row and the second sub-row that are located in the memory.

According to a fifth aspect, a memory controller is provided, including:

a request distribution module, configured to obtain a first memory access request, where the first memory access request is used to request to access a first sub-row in a memory;

a memory scheduler, configured to obtain the first memory access request obtained by the request distribution module, and generate a first activation instruction according to the first memory access request; and a command scheduler, configured to send, to the memory, the first activation instruction obtained from the memory scheduler; where the request distribution module is further configured to search a to-be-scheduled queue of the memory for a second memory access request, where the to-be-scheduled queue of the memory includes multiple memory access requests, the second memory access request is used to request to access a second sub-row in the memory, the first sub-row is located in a first subarray, and the second sub-row is located in a second subarray;

the memory scheduler is further configured to generate a second activation instruction according to the second memory access request; and the command scheduler is further configured to send, to the memory, the second activation instruction obtained from the memory scheduler; where both the first subarray and the second subarray include at least one row, any row in the at least one row includes at least one sub-row, any sub-row in the at least one sub-row includes at least one storage unit, and any storage unit is corresponding to one row number identifier and one column number identifier; and a column number identifier corresponding to any storage unit included in the second sub-row is different from a column number identifier corresponding to any storage unit included in the first sub-row.

With reference to the fifth aspect, in a first possible implementation manner, the request distribution module is further configured to:

obtain a third memory access request, where the third memory access request is used to request to access a third sub-row in the memory, the third sub-row and the first sub-row are located in a same row, and a column number identifier corresponding to any storage unit included in the second sub-row is different from a column number identifier corresponding to any storage unit included in the third sub-row; and the memory scheduler is specifically configured to:

combine the first memory access request and the third memory access request to generate the first activation instruction.

With reference to the fifth aspect or the first possible implementation manner of the fifth aspect, in a second possible implementation manner, the request distribution module is further configured to:

obtain a fourth memory access request, where the fourth memory access request is used to request to access a fourth sub-row in the memory, the fourth sub-row and the second sub-row are located in a same row, and a column number identifier corresponding to any storage unit included in the fourth sub-row is different from a column number identifier corresponding to any storage unit included in the first sub-row; and the memory scheduler is specifically configured to:

combine the second memory access request and the fourth memory access request to generate the second activation instruction.

With reference to the second possible implementation manner of the fifth aspect, in a third possible implementation manner, a column number identifier corresponding to any storage unit included in the fourth sub-row is different from a column number identifier corresponding to any storage unit included in the third sub-row.

According to a sixth aspect, a memory module is provided, including:

a first latch, configured to receive a first activation instruction sent by a memory controller, where the first activation instruction is used to instruct to activate a first sub-row in a memory;

a first sub-row selection decoder, configured to activate the first sub-row located in the memory according to the first activation instruction;

a second latch, configured to receive a second activation instruction sent by the memory controller, where the second activation instruction is used to instruct to activate a second sub-row in the memory; and a second sub-row selection decoder, configured to activate the second sub-row located in the memory according to the second activation instruction; where the first sub-row is located in a first subarray, and the second sub-row is located in a second subarray;

both the first subarray and the second subarray include at least one row, any row in the at least one row includes at least one sub-row, any sub-row in the at least one sub-row includes at least one storage unit, and any storage unit is corresponding to one row number identifier and one column number identifier;

a column number identifier corresponding to any storage unit included in the second sub-row is different from a column number identifier corresponding to any storage unit included in the first sub-row; and both the first latch and the second latch are connected to a global cache that is configured to perform data caching.

With reference to the sixth aspect, in a first possible implementation manner, the first activation instruction is further used to instruct to activate a third sub-row in the memory, and the third sub-row and the first sub-row are located in a same row; and a column number identifier corresponding to any storage unit included in the second sub-row is different from a column number identifier corresponding to any storage unit included in the third sub-row.

With reference to the sixth aspect and the first possible implementation manner of the sixth aspect, in a second possible implementation manner, the second activation instruction is further used to instruct to activate a fourth sub-row in the memory, and the fourth sub-row and the second sub-row are located in a same row;

a column number identifier corresponding to any storage unit included in the fourth sub-row is different from a column number identifier corresponding to any storage unit included in the first sub-row; and a column number identifier corresponding to any storage unit included in the fourth sub-row is different from a column number identifier corresponding to any storage unit included in the third sub-row.

According to a seventh aspect, a memory activation method is provided, including:

obtaining a first memory access request, where the first memory access request is used to request to access a first sub-row in a memory;

generating a first activation instruction according to the first memory access request, and sending the first activation instruction to the memory;

searching a to-be-scheduled queue of the memory for a second memory access request, where the to-be-scheduled queue of the memory includes multiple memory access requests, the second memory access request is used to request to access a second sub-row in the memory, the first sub-row is located in a first subarray, and the second sub-row is located in a second subarray; and generating a second activation instruction according to the second memory access request, and sending the second activation instruction to the memory; where both the first subarray and the second subarray include at least one row, any row in the at least one row includes at least one sub-row, any sub-row in the at least one sub-row includes at least one storage unit, and any storage unit is corresponding to one row number identifier and one column number identifier; and a column number identifier corresponding to any storage unit included in the second sub-row is different from a column number identifier corresponding to any storage unit included in the first sub-row.

With reference to the seventh aspect, in a first possible implementation manner, before the generating a first activation instruction according to the first memory access request, the method further includes:

obtaining a third memory access request, where the third memory access request is used to request to access a third sub-row in the memory, the third sub-row and the first sub-row are located in a same row, and a column number identifier corresponding to any storage unit included in the second sub-row is different from a column number identifier corresponding to any storage unit included in the third sub-row; and the generating a first activation instruction according to the first memory access request specifically includes:

combining the first memory access request and the third memory access request to generate the first activation instruction.

With reference to the seventh aspect and the first possible implementation manner of the seventh aspect, in a second possible implementation manner, before the generating a second activation instruction according to the second memory access request, the method further includes:

obtaining a fourth memory access request, where the fourth memory access request is used to request to access a fourth sub-row in the memory, the fourth sub-row and the second sub-row are located in a same row, and a column number identifier corresponding to any storage unit included in the fourth sub-row is different from a column number identifier corresponding to any storage unit included in the first sub-row; and the generating a second activation instruction according to the second memory access request specifically includes:

combining the second memory access request and the fourth memory access request to generate the second activation instruction.

With reference to the second possible implementation manner of the seventh aspect, in a third possible implementation manner, a column number identifier corresponding to any storage unit included in the fourth sub-row is different from a column number identifier corresponding to any storage unit included in the third sub-row.

According to an eighth aspect, a memory activation method is provided, including:

receiving a first activation instruction sent by a memory controller, where the first activation instruction is used to instruct to activate a first sub-row in a memory;

activating the first sub-row located in the memory according to the first activation instruction;

receiving a second activation instruction sent by the memory controller, where the second activation instruction is used to instruct to activate a second sub-row in the memory; and activating the second sub-row located in the memory according to the second activation instruction; where the first sub-row is located in a first subarray, and the second sub-row is located in a second subarray; both the first subarray and the second subarray include at least one row, any row in the at least one row includes at least one sub-row, any sub-row in the at least one sub-row includes at least one storage unit, and any storage unit is corresponding to one row number identifier and one column number identifier;

a column number identifier corresponding to any storage unit included in the second sub-row is different from a column number identifier corresponding to any storage unit included in the first sub-row; and both the first latch and the second latch are connected to a global cache that is configured to perform data caching.

With reference to the eighth aspect, in a first possible implementation manner, the first activation instruction is further used to instruct to activate a third sub-row in the memory, and the third sub-row and the first sub-row are located in a same row; and a column number identifier corresponding to any storage unit included in the second sub-row is different from a column number identifier corresponding to any storage unit included in the third sub-row; and the activating the first sub-row located in the memory according to the first activation instruction specifically includes:

activating, by a first latch in the memory according to the first activation instruction, the first sub-row and the third sub-row that are located in the memory.

With reference to the eighth aspect and the first possible implementation manner of the eighth aspect, in a second possible implementation manner, the second activation instruction is further used to instruct to activate a fourth sub-row in the memory, and the fourth sub-row and the second sub-row are located in a same row; and a column number identifier corresponding to any storage unit included in the fourth sub-row is different from a column number identifier corresponding to any storage unit included in the third sub-row; and the activating the second sub-row located in the memory according to the second activation instruction specifically includes:

activating, by a second latch in the memory according to the second activation instruction, the second sub-row and the fourth sub-row that are located in the memory.

Beneficial effects of the present disclosure are as follows:

In the prior art, multiple storage units cannot be activated simultaneously, but instead, each time after a storage unit is activated, the storage unit needs to be precharged, and then an activation operation can be performed on a next storage unit. Therefore, a current memory activation method has a disadvantage of relatively low efficiency. In the embodiments of the present disclosure, after a first memory access request is obtained, where the first memory access request is used to request to access a first sub-row in a memory, the first sub-row is not activated immediately. Instead, a to-be-scheduled queue of the memory is searched for a second memory access request, where the second memory access request is used to request to access a second sub-row in the memory, and the first sub-row and the second sub-row are located in a same row in the memory. Then the first memory access request and the second memory access request are combined to generate a first activation instruction, where the first activation instruction is used to instruct to activate the first sub-row and the second sub-row in the memory. The first activation instruction is sent to the memory. In this way, the first sub-row and the second sub-row can be activated simultaneously, and it is unnecessary to precharge, after activation of the first sub-row, a row at which the first sub-row is located, and then activate the second sub-row. Therefore, efficiency of memory activation is improved.

DESCRIPTION OF EMBODIMENTS

To make the objectives, technical solutions, and advantages of the embodiments of the present disclosure clearer, the following clearly describes the technical solutions in the embodiments of the present disclosure with reference to the accompanying drawings in the embodiments of the present disclosure. Apparently, the described embodiments are some but not all of the embodiments of the present disclosure. All other embodiments obtained by persons of ordinary skill in the art based on the embodiments of the present disclosure without creative efforts shall fall within the protection scope of the present disclosure.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

The following describes implementation manners of the present disclosure in detail with reference to the accompanying drawings. It should be understood that the embodiments described herein are merely used to describe and explain the present disclosure, but are not intended to limit the present disclosure. In addition, the embodiments of the present application and features in the embodiments may be mutually combined if they do not conflict with each other.

The following describes the preferred implementation manners of the present disclosure in detail with reference to the accompanying drawings.

Figure 1A:
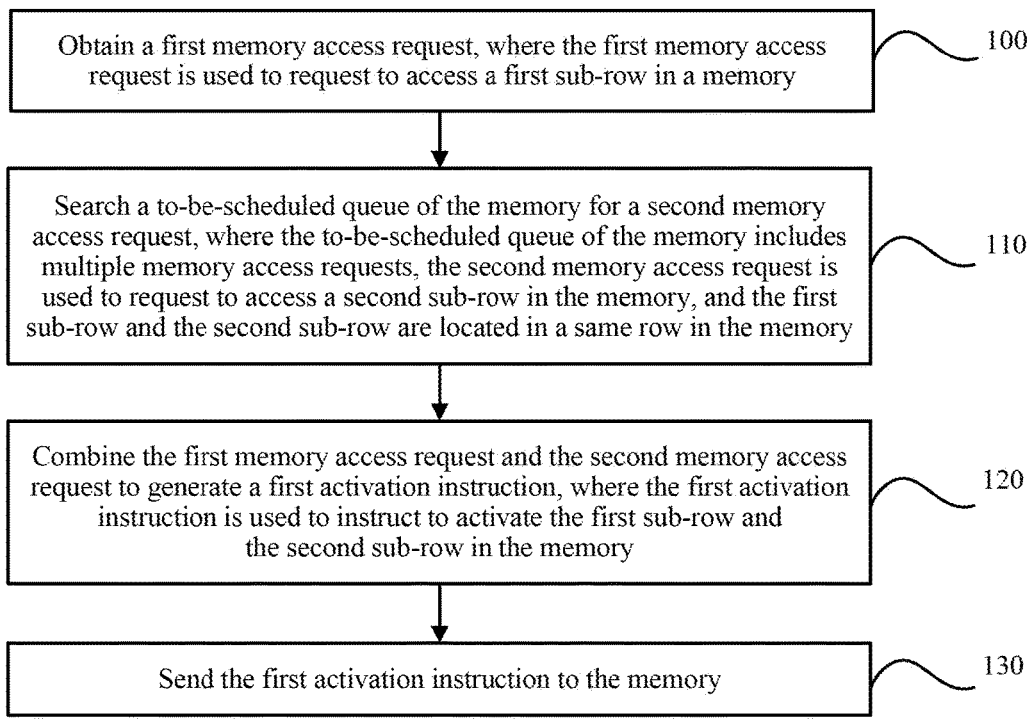
FIG. 1A is a flowchart of memory activation according to an embodiment of the present disclosure.

As shown in FIG. 1A, in an embodiment of the present disclosure, a procedure of memory activation is as follows:

Step 100: Obtain a first memory access request, where the first memory access request is used to request to access a first sub-row in a memory.

Step 110: Search a to-be-scheduled queue of the memory for a second memory access request, where the to-be-scheduled queue of the memory includes multiple memory access requests, the second memory access request is used to request to access a second sub-row in the memory, and the first sub-row and the second sub-row are located in a same row in the memory.

Step 120: Combine the first memory access request and the second memory access request to generate a first activation instruction, where the first activation instruction is used to instruct to activate the first sub-row and the second sub-row in the memory.

Step 130: Send the first activation instruction to the memory.

In this embodiment of the present disclosure, whether row addresses of rows in which the first sub-row and the second sub-row that are to be activated are located are the same may be viewed to identify whether the first sub-row and the second sub-row that are to be activated are located in a same row.

In this embodiment of the present disclosure, to enable the memory to learn which sub-row needs to be activated and which sub-row does not need to be activated, after the searching a to-be-scheduled queue of the memory for a second memory access request, the following operation is further included:

generating a sub-row selection vector, and sending the sub-row selection vector to the memory; where the sub-row selection vector is used to identify that sub-rows to be activated are the first sub-row and the second sub-row.

Figure 1B:
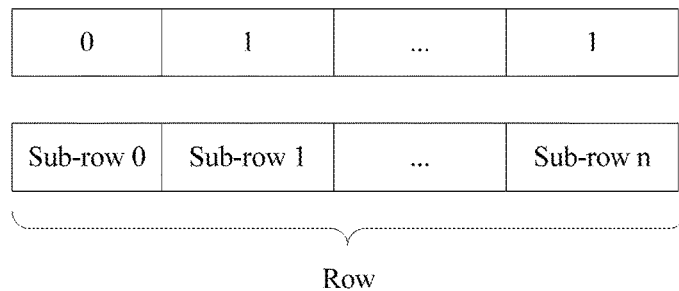
FIG. 1B is a schematic diagram of a sub-row selection vector according to an embodiment of the present disclosure.

For example, N sub-rows are located in one row, each value in the sub-row selection vector is corresponding to one sub-row, and the value is used to indicate whether the corresponding sub-row is to be activated or not. As shown in FIG. 1B, when a value in the sub-row selection vector is 0, it indicates that a corresponding sub-row is to be activated; when a value in the sub-row selection vector is 1, it indicates that a corresponding sub-row is not to be activated. Certainly, whether a corresponding sub-row is to be activated may be indicated in another form, and details are not described herein.

In this embodiment of the present disclosure, the sub-row selection vector may be sent simultaneously with the first activation instruction. For example, the sub-row selection vector is added into the first activation instruction, and in this case, in specific implementation, the sub-row selection vector and the first activation instruction are written simultaneously on a memory bus. Alternatively, the sub-row selection vector may be sent before the first activation instruction is sent, and in this case, in specific implementation, before the first activation instruction is written on a memory bus, the sub-row selection vector is written by using the bus.

In this embodiment of the present disclosure, after the first sub-row and the second sub-row are activated, data in the first sub-row and data in the second sub-row are fetched into corresponding sub-row caches. A sub-row that is not selected is not activated, and corresponding data is not fetched into a corresponding sub-row cache.

In this solution, when a first memory access request is received, a first sub-row that the first memory access request requests to access is not activated immediately. Instead, memory access requests in a to-be-scheduled queue of a memory are scheduled to search for a second memory access request. The first memory access request and the second memory access request are combined into a first activation instruction, and the first activation instruction is sent to the memory. In this way, the first sub-row and the second sub-row can be activated at a time, and activation efficiency is improved.

Figure 2:
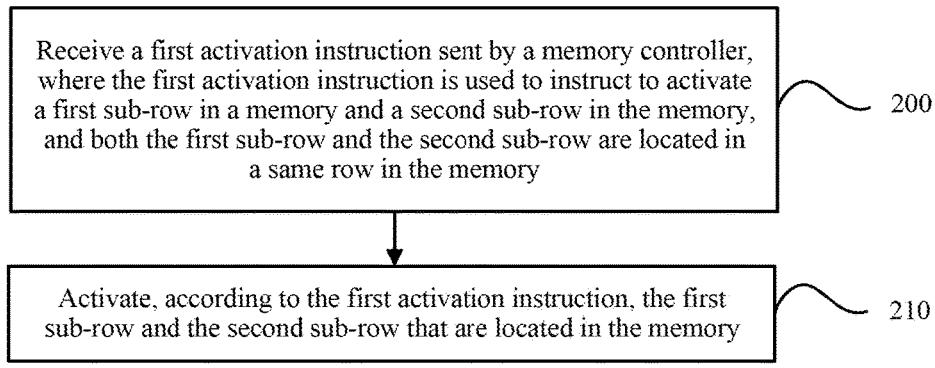
FIG. 2 is another flowchart of memory activation according to an embodiment of the present disclosure.

As shown in FIG. 2, in an embodiment of the present disclosure, another procedure of memory activation is as follows:

Step 200: Receive a first activation instruction sent by a memory controller, where the first activation instruction is used to instruct to activate a first sub-row and a second sub-row in a memory, and both the first sub-row and the second sub-row are located in a same row in the memory.

Step 210: Activate, according to the first activation instruction, the first sub-row and the second sub-row that are located in the memory.

In this embodiment of the present disclosure, before the activating, according to the first activation instruction, the first sub-row and the second sub-row that are located in the memory, the following operation is further included:

receiving a sub-row selection vector sent by the memory controller, where the sub-row selection vector is used to identify that sub-rows to be activated are the first sub-row and the second sub-row.

When the first sub-row and the second sub-row that are located in the memory are activated according to the first activation instruction, the following manner may be used:

activating, according to the sub-row selection vector in the first activation instruction, the first sub-row and the second sub-row that are located in the memory.

Figure 3:
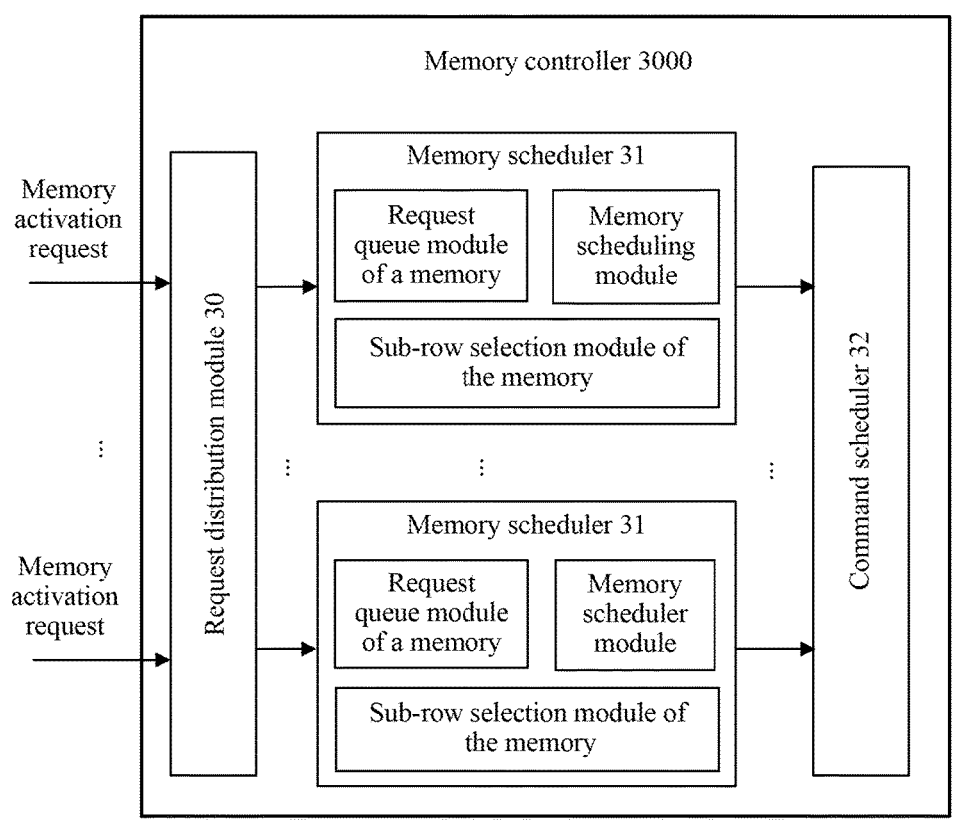
FIG. 3 is a schematic diagram of a memory controller according to an embodiment of the present disclosure.

Based on the technical solutions of the foregoing corresponding methods, as shown in FIG. 3, an embodiment of the present disclosure provides a memory controller 3000, and the memory controller 3000 includes a request distribution module 30, a memory scheduler 31, and a command scheduler 32.

The request distribution module 30 is configured to obtain a first memory access request, where the first memory access request is used to request to access a first sub-row in a memory.

The memory scheduler 31 is configured to search a to-be-scheduled queue of the memory for a second memory access request, where the to-be-scheduled queue of the memory includes multiple memory access requests, the second memory access request is used to request to access a second sub-row in the memory, and the first sub-row and the second sub-row are located in a same row in the memory.

The memory scheduler 31 is further configured to combine the first memory access request and the second memory access request to generate a first activation instruction, where the first activation instruction is used to instruct to activate the first sub-row and the second sub-row in the memory.

The command scheduler 32 is configured to send the first activation instruction to the memory.

In this embodiment of the present disclosure, the memory scheduler 31 is further configured to:

generate a sub-row selection vector, and send the sub-row selection vector to the memory; where the sub-row selection vector is used to identify that sub-rows to be activated are the first sub-row and the second sub-row.

Figure 4:
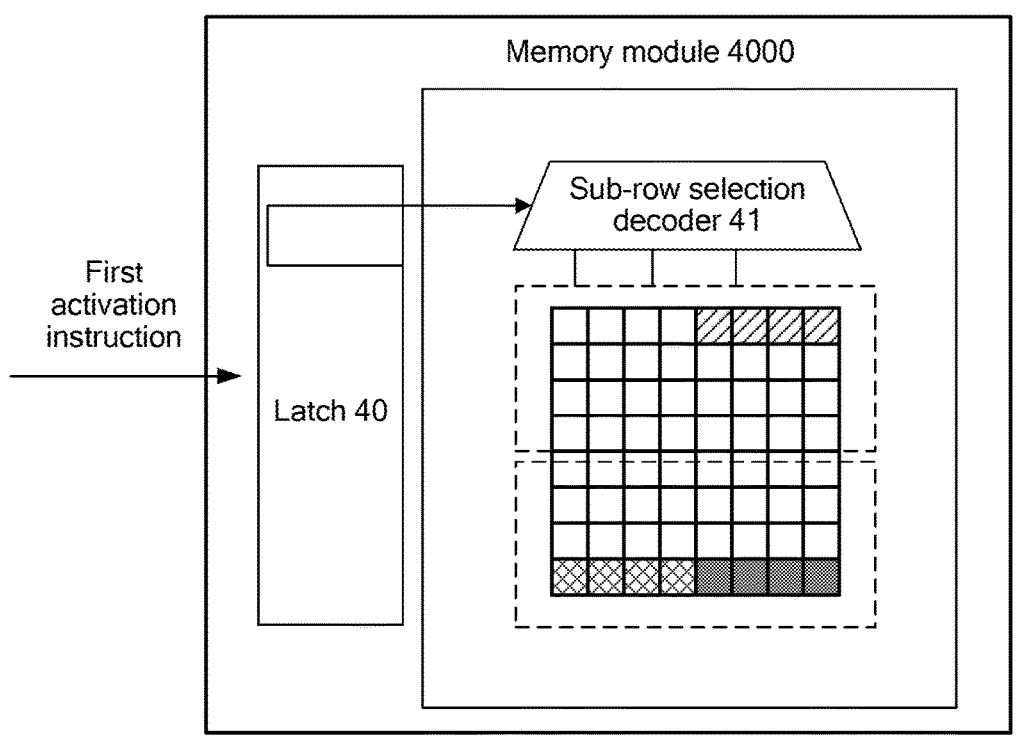
FIG. 4 is a schematic diagram of a memory module according to an embodiment of the present disclosure.

Based on the technical solutions of the foregoing corresponding methods, as shown in FIG. 4, an embodiment of the present disclosure provides a memory module 4000, and the memory module 4000 includes a latch 40 and a sub-row selection decoder 41.

The latch 40 is configured to receive a first activation instruction sent by a memory controller, where the first activation instruction is used to instruct to activate a first sub-row and a second sub-row in a memory, and both the first sub-row and the second sub-row are located in a same row in the memory.

The sub-row selection decoder 41 is configured to activate, according to the first activation instruction obtained from the latch 40, the first sub-row and the second sub-row that are located in the memory.

The latch 40 is further configured to:

receive a sub-row selection vector sent by the memory controller, where the sub-row selection vector is used to identify that sub-rows to be activated are the first sub-row and the second sub-row.

The sub-row selection decoder 41 is specifically configured to:

activate, according to the sub-row selection vector in the first activation instruction, the first sub-row and the second sub-row that are located in the memory.

Figure 5A:
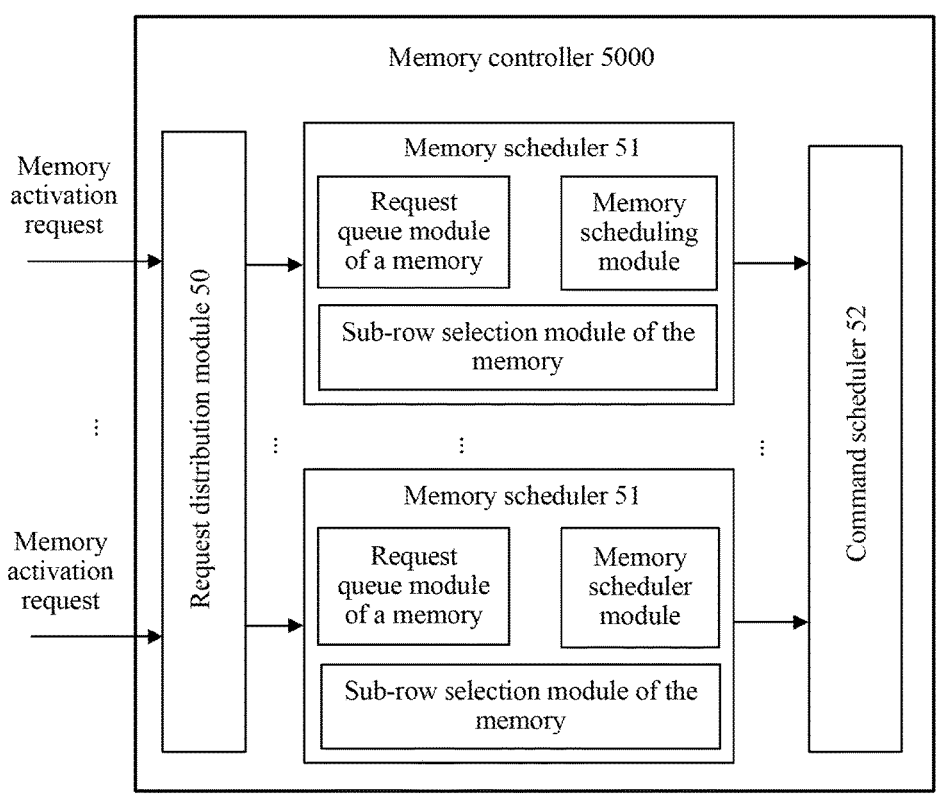
FIG. 5A is another schematic diagram of a memory controller according to an embodiment of the present disclosure.

In an embodiment of the present disclosure, to improve resource utilization of a storage unit, as shown in FIG. 5A, a memory controller 5000 is provided, and the memory controller 5000 includes a request distribution module 50, a memory scheduler 51, and a command scheduler 52.

The request distribution module 50 is configured to obtain a first memory access request, where the first memory access request is used to request to access a first sub-row in a memory.

The memory scheduler 51 is configured to obtain the first memory access request obtained by the request distribution module 50, and generate a first activation instruction according to the first memory access request.

The command scheduler 52 is configured to send, to the memory, the first activation instruction obtained from the memory scheduler 51.

The request distribution module 50 is further configured to search a to-be-scheduled queue of the memory for a second memory access request, where the to-be-scheduled queue of the memory includes multiple memory access requests, the second memory access request is used to request to access a second sub-row in the memory, the first sub-row is located in a first subarray, and the second sub-row is located in a second subarray.

The memory scheduler 51 is further configured to generate a second activation instruction according to the second memory access request.

The command scheduler 52 is further configured to send, to the memory, the second activation instruction obtained from the memory scheduler 51.

Both the first subarray and the second subarray include at least one row, any row in the at least one row includes at least one sub-row, any sub-row in the at least one sub-row includes at least one storage unit, and any storage unit is corresponding to one row number identifier and one column number identifier.

A column number identifier corresponding to any storage unit included in the second sub-row is different from a column number identifier corresponding to any storage unit included in the first sub-row.

Figure 5B:
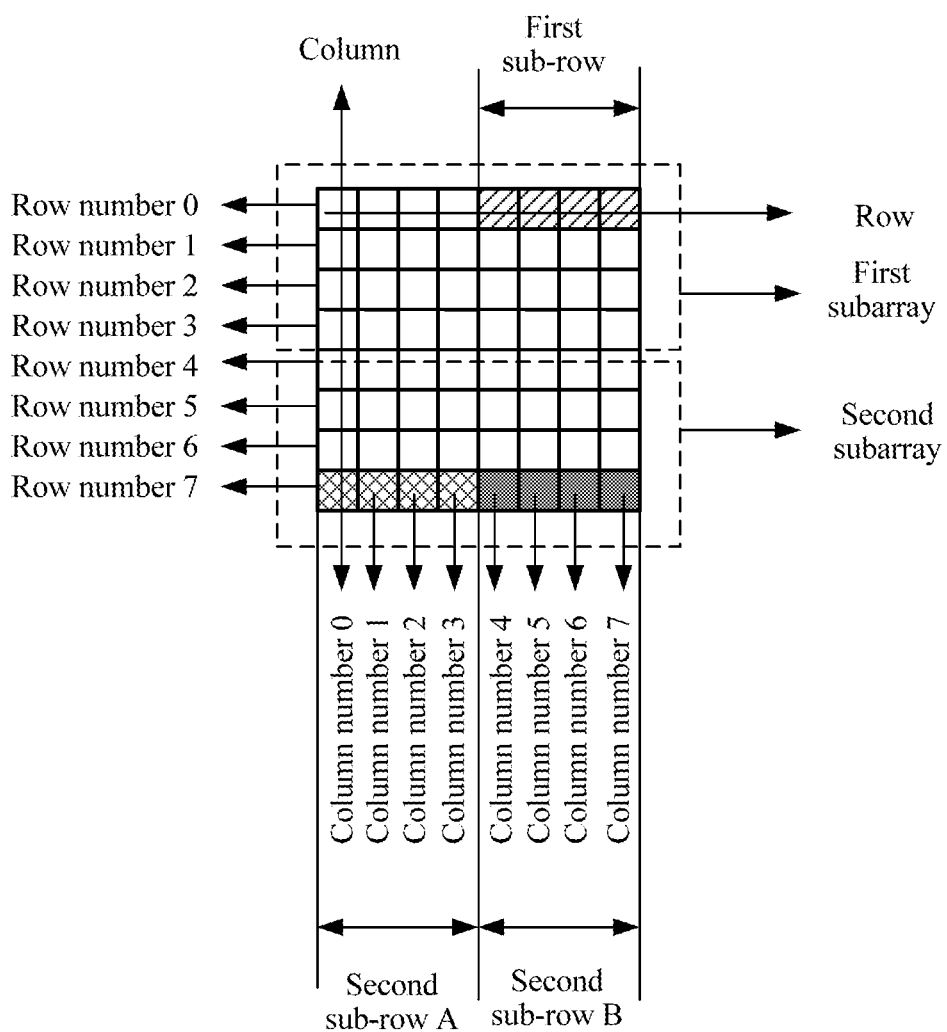
FIG. 5B is a schematic diagram of a memory according to an embodiment of the present disclosure.

In this embodiment of the present disclosure, a relationship between a subarray, a row, a column, and a storage unit is shown in FIG. 5B.

Further, in this embodiment of the present disclosure, the request distribution module 50 is further configured to:

obtain a third memory access request, where the third memory access request is used to request to access a third sub-row in the memory, the third sub-row and the first sub-row are located in a same row, and a column number identifier corresponding to any storage unit included in the second sub-row is different from a column number identifier corresponding to any storage unit included in the third sub-row.

The memory scheduler 51 is specifically configured to:

combine the first memory access request and the third memory access request to generate the first activation instruction.

In this embodiment of the present disclosure, further, the request distribution module 50 is further configured to:

obtain a fourth memory access request, where the fourth memory access request is used to request to access a fourth sub-row in the memory, the fourth sub-row and the second sub-row are located in a same row, and a column number identifier corresponding to any storage unit included in the fourth sub-row is different from a column number identifier corresponding to any storage unit included in the first sub-row.

The memory scheduler 51 is specifically configured to:

combine the second memory access request and the fourth memory access request to generate the second activation instruction.

In this embodiment of the present disclosure, optionally, a column number identifier corresponding to any storage unit included in the fourth sub-row is different from a column number identifier corresponding to any storage unit included in the third sub-row.

In this solution, after a first sub-row is activated, when a column number identifier corresponding to any storage unit included in a second sub-row is different from a column number identifier corresponding to any storage unit included in the first sub-row, a second sub-row that is located in a different subarray from the first sub-row may be activated, so that resource utilization is improved.

Figure 6:
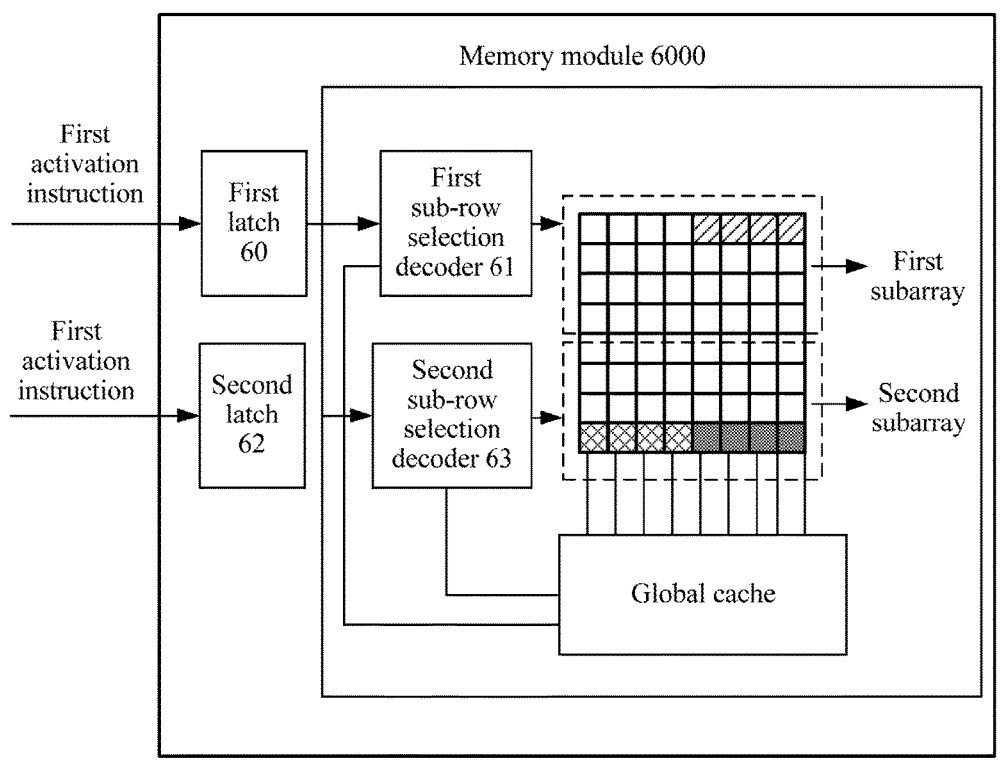
FIG. 6 is another schematic diagram of a memory module according to an embodiment of the present disclosure.

In an embodiment of the present disclosure, to improve resource utilization of a storage unit, as shown in FIG. 6, a memory module 6000 is provided, and the memory module 6000 includes a first latch 60, a first sub-row selection decoder 61, a second latch 62, and a second sub-row selection decoder 63.

The first latch 60 is configured to receive a first activation instruction sent by a memory controller, where the first activation instruction is used to instruct to activate a first sub-row in a memory.

The first sub-row selection decoder 61 is configured to activate the first sub-row located in the memory according to the first activation instruction.

The second latch 62 is configured to receive a second activation instruction sent by the memory controller, where the second activation instruction is used to instruct to activate a second sub-row in the memory.

The second sub-row selection decoder 63 is configured to activate the second sub-row located in the memory according to the second activation instruction.

The first sub-row is located in a first subarray, and the second sub-row is located in a second subarray.

Both the first subarray and the second subarray include at least one row, any row in the at least one row includes at least one sub-row, any sub-row in the at least one sub-row includes at least one storage unit, and any storage unit is corresponding to one row number identifier and one column number identifier.

A column number identifier corresponding to any storage unit included in the second sub-row is different from a column number identifier corresponding to any storage unit included in the first sub-row.

Both the first latch 60 and the second latch 62 are connected to a global cache that is configured to perform data caching.

In this embodiment of the present disclosure, further, the first activation instruction is further used to instruct to activate a third sub-row in the memory, and the third sub-row and the first sub-row are located in a same row.

A column number identifier corresponding to any storage unit included in the second sub-row is different from a column number identifier corresponding to any storage unit included in the third sub-row.

In this embodiment of the present disclosure, further, the second activation instruction is further used to instruct to activate a fourth sub-row in the memory, and the fourth sub-row and the second sub-row are located in a same row.

A column number identifier corresponding to any storage unit included in the fourth sub-row is different from a column number identifier corresponding to any storage unit included in the first sub-row.

A column number identifier corresponding to any storage unit included in the fourth sub-row is different from a column number identifier corresponding to any storage unit included in the third sub-row.

In this solution, after a first latch activates a first sub-row, when a column number identifier corresponding to any storage unit included in a second sub-row is different from a column number identifier corresponding to any storage unit included in the first sub-row, a second latch may activate a second sub-row that is located in a different subarray from the first sub-row, so that resource utilization is improved.

Figure 7:
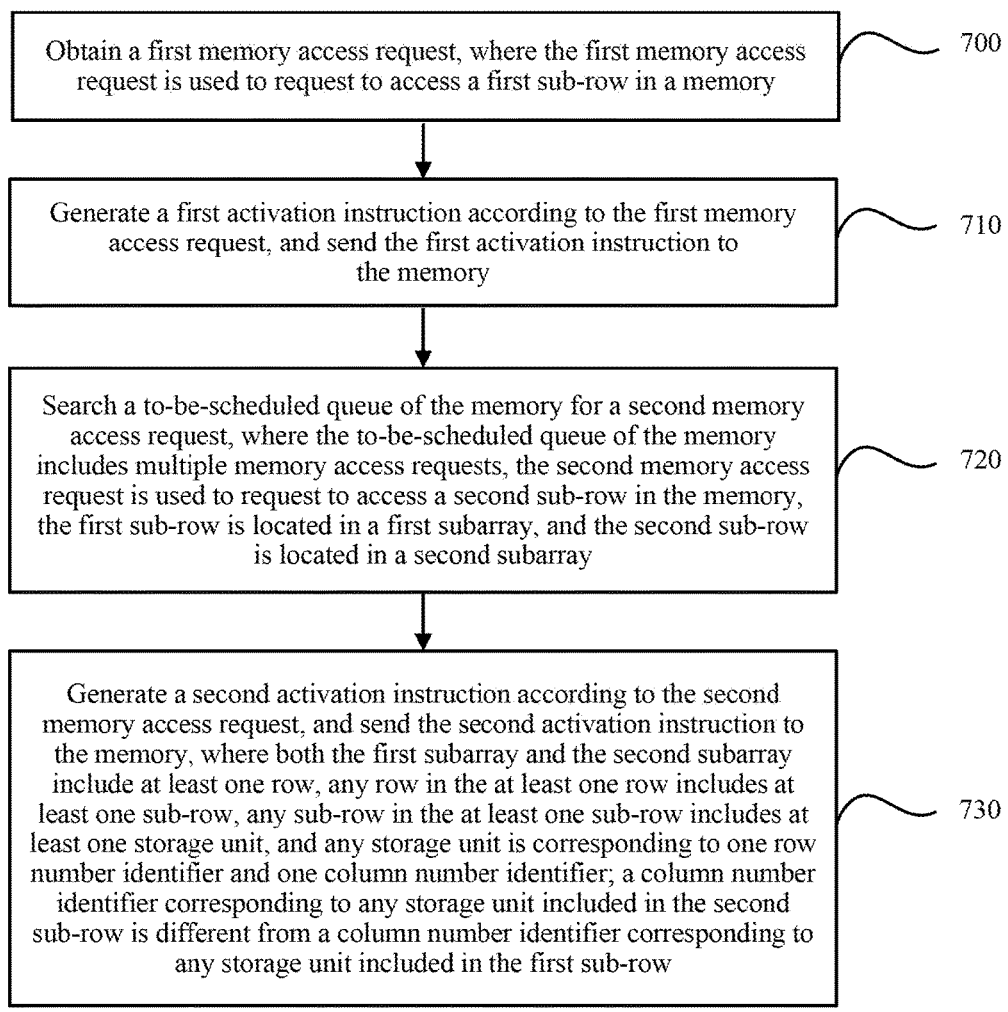
FIG. 7 is another flowchart of memory activation according to an embodiment of the present disclosure.

As shown in FIG. 7, in an embodiment of the present disclosure, another procedure of memory activation is as follows:

Step 700: Obtain a first memory access request, where the first memory access request is used to request to access a first sub-row in a memory.

Step 710: Generate a first activation instruction according to the first memory access request, and send the first activation instruction to the memory.

Step 720: Search a to-be-scheduled queue of the memory for a second memory access request, where the to-be-scheduled queue of the memory includes multiple memory access requests, the second memory access request is used to request to access a second sub-row in the memory, the first sub-row is located in a first subarray, and the second sub-row is located in a second subarray.

Step 730: Generate a second activation instruction according to the second memory access request, and send the second activation instruction to the memory.

Both the first subarray and the second subarray include at least one row, any row in the at least one row includes at least one sub-row, any sub-row in the at least one sub-row includes at least one storage unit, and any storage unit is corresponding to one row number identifier and one column number identifier.

A column number identifier corresponding to any storage unit included in the second sub-row is different from a column number identifier corresponding to any storage unit included in the first sub-row.

In this embodiment of the present disclosure, further, before the generating a first activation instruction according to the first memory access request, the following operation is further included:

obtaining a third memory access request, where the third memory access request is used to request to access a third sub-row in the memory, the third sub-row and the first sub-row are located in a same row, and a column number identifier corresponding to any storage unit included in the second sub-row is different from a column number identifier corresponding to any storage unit included in the third sub-row.

The generating a first activation instruction according to the first memory access request specifically includes:

combining the first memory access request and the third memory access request to generate the first activation instruction.

In this embodiment of the present disclosure, further, before the generating a second activation instruction according to the second memory access request, the following operation is further included:

obtaining a fourth memory access request, where the fourth memory access request is used to request to access a fourth sub-row in the memory, the fourth sub-row and the second sub-row are located in a same row, and a column number identifier corresponding to any storage unit included in the fourth sub-row is different from a column number identifier corresponding to any storage unit included in the first sub-row.

The generating a second activation instruction according to the second memory access request specifically includes:

combining the second memory access request and the fourth memory access request to generate the second activation instruction.

In this embodiment of the present disclosure, optionally, a column number identifier corresponding to any storage unit included in the fourth sub-row is different from a column number identifier corresponding to any storage unit included in the third sub-row.

In this solution, after a first sub-row is activated, when a column number identifier corresponding to any storage unit included in a second sub-row is different from a column number identifier corresponding to any storage unit included in the first sub-row, a second sub-row that is located in a different subarray from the first sub-row may be activated, so that resource utilization is improved.

Figure 8:
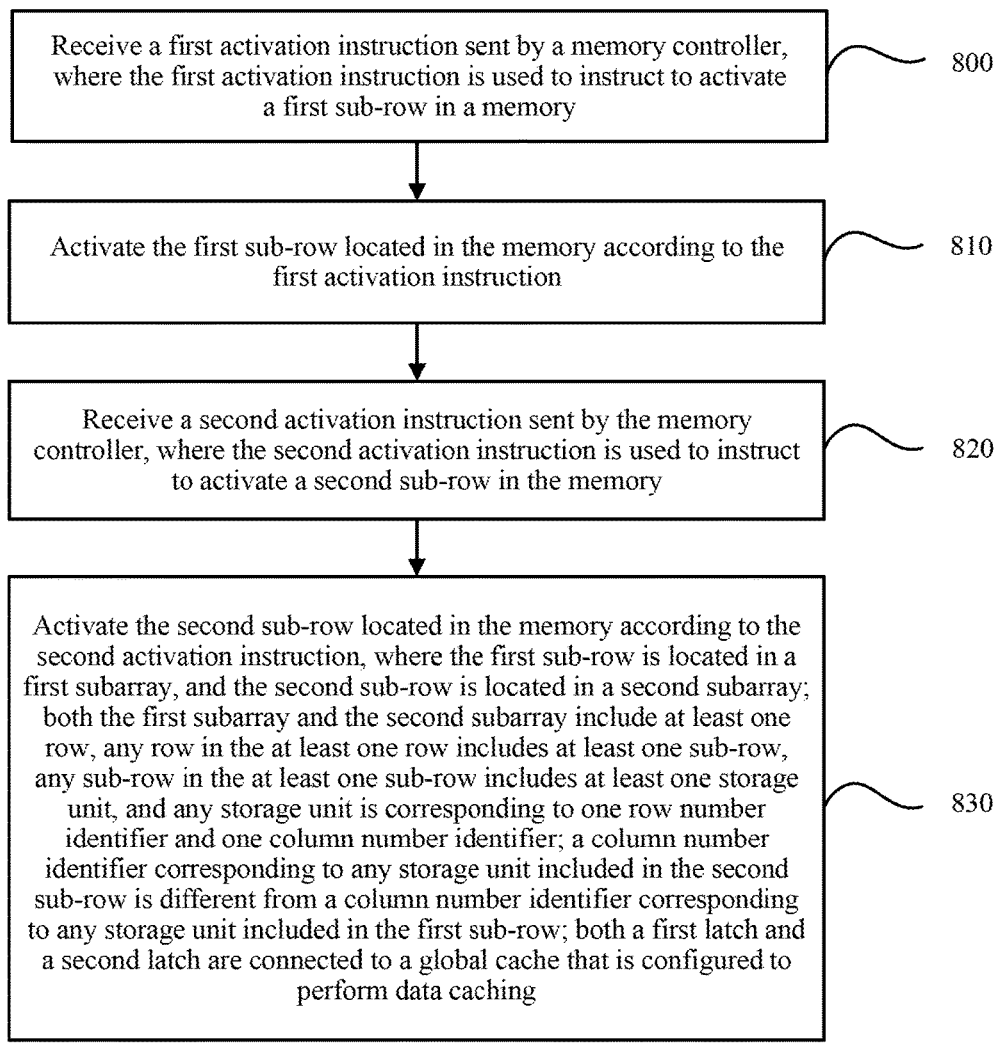
FIG. 8 is another flowchart of memory activation according to an embodiment of the present disclosure.

As shown in FIG. 8, in an embodiment of the present disclosure, another procedure of memory activation is as follows:

Step 800: Receive a first activation instruction sent by a memory controller, where the first activation instruction is used to instruct to activate a first sub-row in a memory.

Step 810: Activate the first sub-row located in the memory according to the first activation instruction.

Step 820: Receive a second activation instruction sent by the memory controller, where the second activation instruction is used to instruct to activate a second sub-row in the memory.

Step 830: Activate the second sub-row located in the memory according to the second activation instruction, where the first sub-row is located in a first subarray, and the second sub-row is located in a second subarray; both the first subarray and the second subarray include at least one row, any row in the at least one row includes at least one sub-row, any sub-row in the at least one sub-row includes at least one storage unit, and any storage unit is corresponding to one row number identifier and one column number identifier; a column number identifier corresponding to any storage unit included in the second sub-row is different from a column number identifier corresponding to any storage unit included in the first sub-row; both a first latch and a second latch are connected to a global cache that is configured to perform data caching.

In this embodiment of the present disclosure, further, the first activation instruction is further used to instruct to activate a third sub-row in the memory, and the third sub-row and the first sub-row are located in a same row.

A column number identifier corresponding to any storage unit included in the second sub-row is different from a column number identifier corresponding to any storage unit included in the third sub-row.

The activating the first sub-row located in the memory according to the first activation instruction specifically includes:

activating, by a first latch in the memory according to the first activation instruction, the first sub-row and the third sub-row that are located in the memory.

In this embodiment of the present disclosure, optionally, the second activation instruction is further used to instruct to activate a fourth sub-row in the memory, and the fourth sub-row and the second sub-row are located in a same row.

A column number identifier corresponding to any storage unit included in the fourth sub-row is different from a column number identifier corresponding to any storage unit included in the third sub-row.

The activating the second sub-row located in the memory according to the second activation instruction specifically includes:

activating, by a second latch in the memory according to the second activation instruction, the second sub-row and the fourth sub-row that are located in the memory.

In this solution, after a first latch activates a first sub-row, when a column number identifier corresponding to any storage unit included in a second sub-row is different from a column number identifier corresponding to any storage unit included in the first sub-row, a second latch may activate a second sub-row that is located in a different subarray from the first sub-row, so that resource utilization is improved.

The foregoing FIG. 5A, FIG. 5B, FIG. 6, FIG. 7, and FIG. 8 describe that after a first sub-row is activated, only when a column number identifier corresponding to any storage unit included in a second sub-row that is located in a different subarray from the first sub-row is different from a column number identifier corresponding to any storage unit included in the first sub-row, the second sub-row can be activated. Further, to improve resource utilization, the following solution is put forward.

Figure 9:
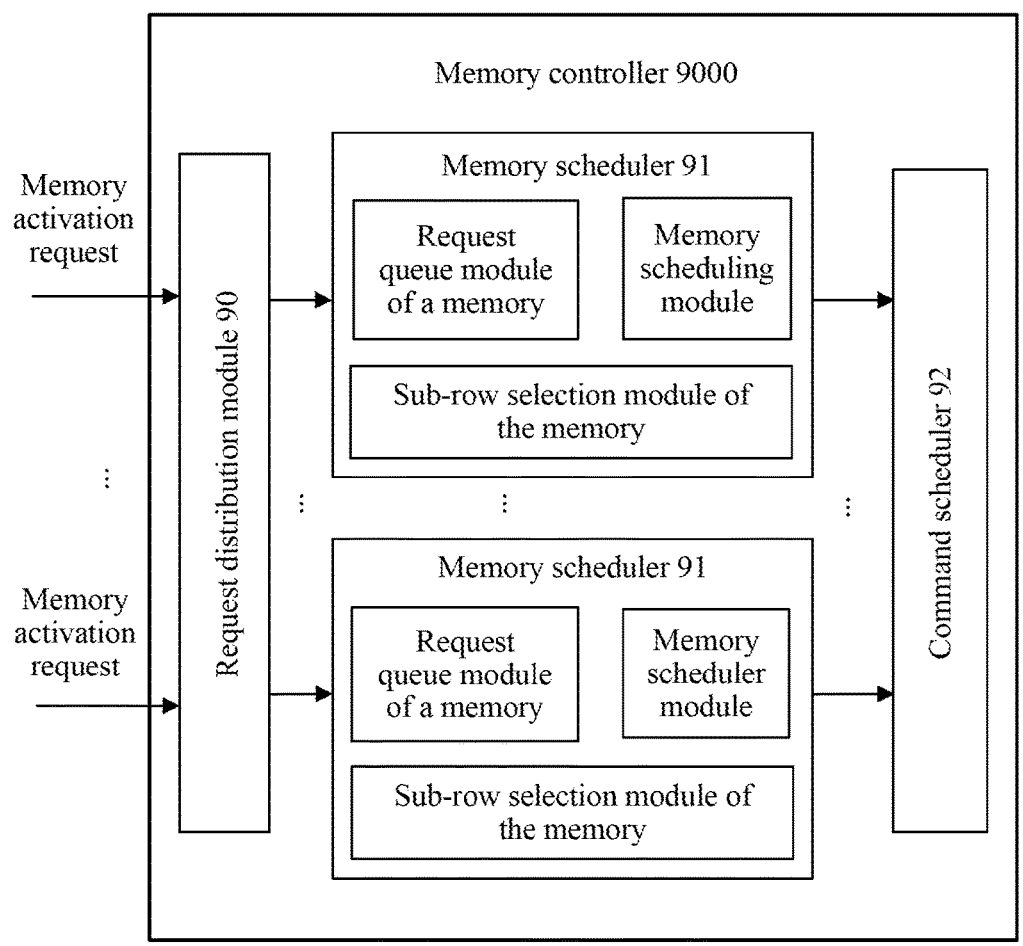
FIG. 9 is another schematic diagram of a memory controller according to an embodiment of the present disclosure.

In an embodiment of the present disclosure, to improve resource utilization of a storage unit, as shown in FIG. 9, a memory controller 9000 is provided, and the memory controller 9000 includes a request distribution module 90, a memory scheduler 91, and a command scheduler 92.

The request distribution module 90 is configured to obtain a first memory access request, where the first memory access request is used to request to access a first sub-row in a memory.

The memory scheduler 91 is configured to obtain the first memory access request obtained by the request distribution module 90, and generate a first activation instruction according to the first memory access request.

The command scheduler 92 is configured to send, to the memory, the first activation instruction obtained from the memory scheduler 91.

The request distribution module 90 is further configured to search a to-be-scheduled queue of the memory for a second memory access request, where the to-be-scheduled queue of the memory includes multiple memory access requests, the second memory access request is used to request to access a second sub-row in the memory, the first sub-row is located in a first subarray, and the second sub-row is located in a second subarray.

The memory scheduler 91 is further configured to generate a second activation instruction according to the second memory access request.

The command scheduler 92 is further configured to send, to the memory, the second activation instruction obtained from the memory scheduler 91.

Both the first subarray and the second subarray include at least one row, any row in the at least one row includes at least one sub-row, any sub-row in the at least one sub-row includes at least one storage unit, and any storage unit is corresponding to one row number identifier and one column number identifier.

The second sub-row includes a storage unit whose column number identifier is the same as a column number identifier corresponding to a storage unit included in the first sub-row.

In this embodiment of the present disclosure, further, the request distribution module 90 is further configured to:

obtain a third memory access request, where the third memory access request is used to request to access a third sub-row in the memory, the third sub-row and the first sub-row are located in a same row, and the second sub-row includes a storage unit whose column number identifier is the same as a column number identifier corresponding to a storage unit included in the third sub-row.

The memory scheduler 91 is specifically configured to:

combine the first memory access request and the third memory access request to generate the first activation instruction.

In this embodiment of the present disclosure, further, the request distribution module 90 is further configured to:

obtain a fourth memory access request, where the fourth memory access request is used to request to access a fourth sub-row in the memory, the fourth sub-row and the second sub-row are located in a same row, and the fourth sub-row includes a storage unit whose column number identifier is the same as the column number identifier corresponding to the storage unit included in the first sub-row.

The memory scheduler 91 is specifically configured to:

combine the second memory access request and the fourth memory access request to generate the second activation instruction.

In this embodiment of the present disclosure, optionally, the fourth sub-row includes a storage unit whose column number identifier is the same as the column number identifier corresponding to the storage unit included in the third sub-row.

In this solution, after a first latch activates a first sub-row, when a second sub-row includes a storage unit whose column number identifier is the same as a column number identifier corresponding to a storage unit included in the first sub-row, a second latch may also activate a second sub-row that is located in a different subarray from the first sub-row, so that resource utilization is improved.

Figure 10:
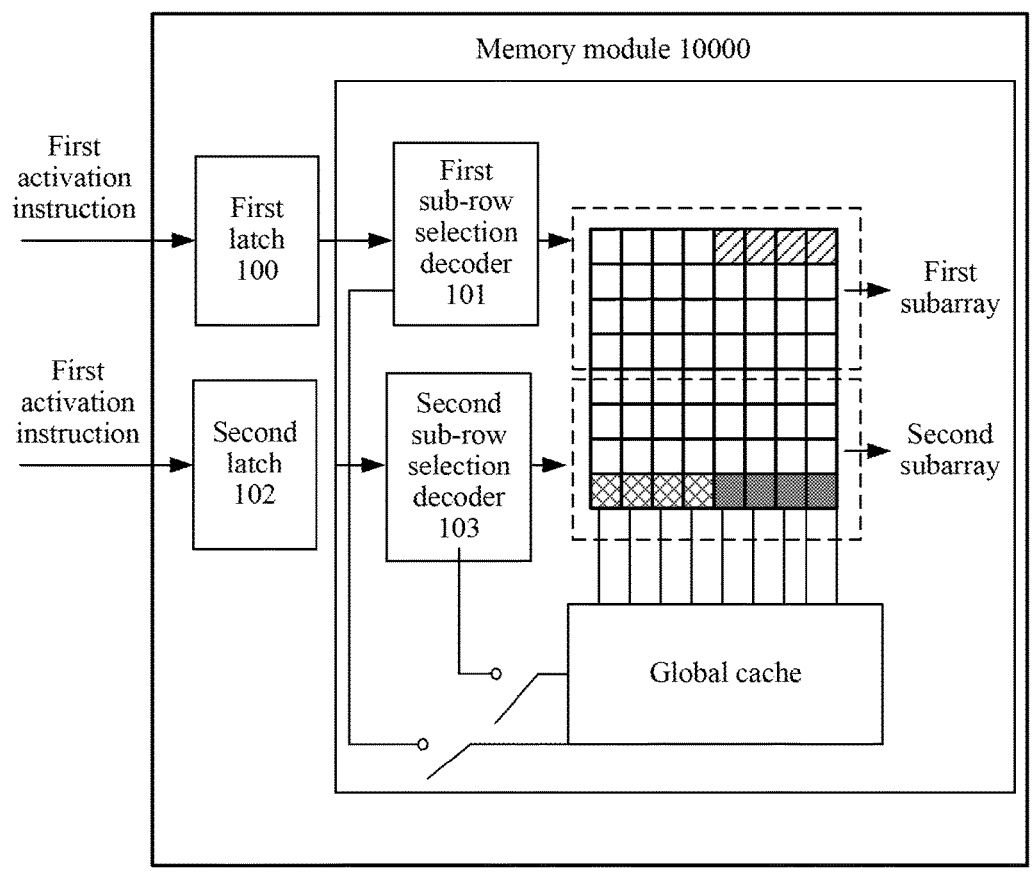
FIG. 10 is another schematic diagram of a memory module according to an embodiment of the present disclosure.

In an embodiment of the present disclosure, to improve resource utilization of a storage unit, as shown in FIG. 10, a memory module 10000 is provided, and the memory module 10000 includes a first latch 100, a first sub-row selection decoder 101, a second latch 102, and a second sub-row selection decoder 103.

The first latch 100 is configured to receive a first activation instruction sent by a memory controller, where the first activation instruction is used to instruct to activate a first sub-row in a memory.

The first sub-row selection decoder 101 is configured to activate the first sub-row located in the memory according to the first activation instruction.

The second latch 102 is configured to receive a second activation instruction sent by the memory controller, where the second activation instruction is used to instruct to activate a second sub-row in the memory.

The second sub-row selection decoder 103 is configured to activate the second sub-row located in the memory according to the second activation instruction.

The first sub-row is located in a first subarray, and the second sub-row is located in a second subarray.

Both the first subarray and the second subarray include at least one row, any row in the at least one row includes at least one sub-row, any sub-row in the at least one sub-row includes at least one storage unit, and any storage unit is corresponding to one row number identifier and one column number identifier.

The second sub-row includes a storage unit whose column number identifier is the same as a column number identifier corresponding to a storage unit included in the first sub-row.

Neither the first latch 100 nor the second latch 102 is connected to a global cache that is configured to perform data caching.

In this embodiment of the present disclosure, further, the first activation instruction is further used to instruct to activate a third sub-row in the memory, and the third sub-row and the first sub-row are located in a same row.

The second sub-row includes a storage unit whose column number identifier is the same as a column number identifier corresponding to a storage unit included in the third sub-row.

In this embodiment of the present disclosure, further, the second activation instruction is further used to instruct to activate a fourth sub-row in the memory, and the fourth sub-row and the second sub-row are located in a same row.

The fourth sub-row includes a storage unit whose column number identifier is the same as the column number identifier corresponding to the storage unit included in the first sub-row.

The fourth sub-row includes a storage unit whose column number identifier is the same as the column number identifier corresponding to the storage unit included in the third sub-row.

In this solution, after a first latch activates a first sub-row, when a second sub-row includes a storage unit whose column number identifier is the same as a column number identifier corresponding to a storage unit included in the first sub-row, a second latch may also activate a second sub-row that is located in a different subarray from the first sub-row, so that resource utilization is improved.

Figure 11:
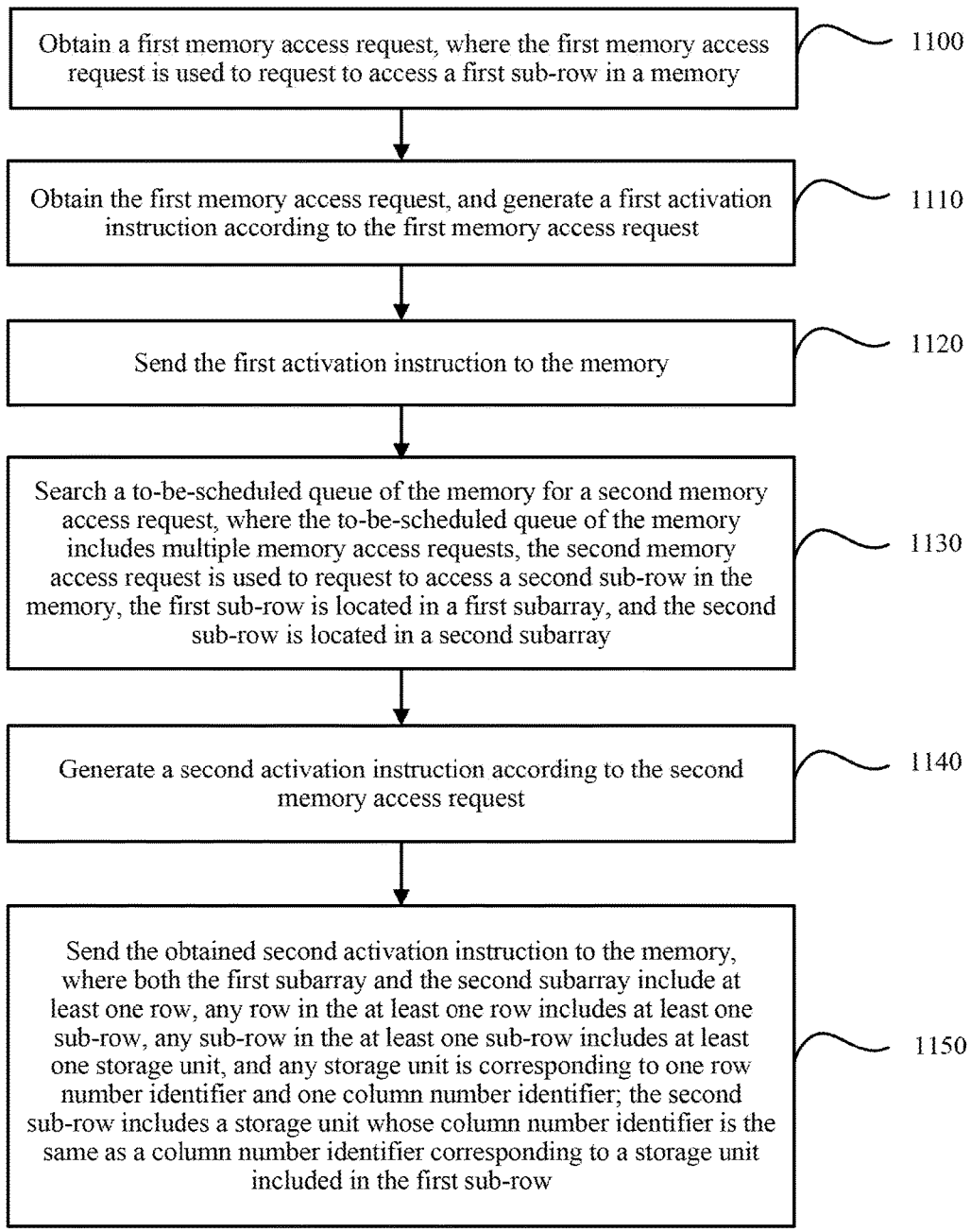
FIG. 11 is another flowchart of memory activation according to an embodiment of the present disclosure.

In an embodiment of the present disclosure, to improve resource utilization of a storage unit, as shown in FIG. 11, another memory activation method is provided:

Step 1100: Obtain a first memory access request, where the first memory access request is used to request to access a first sub-row in a memory.

Step 1110: Obtain the first memory access request, and generate a first activation instruction according to the first memory access request.

Step 1120: Send the first activation instruction to the memory.

Step 1130: Search a to-be-scheduled queue of the memory for a second memory access request, where the to-be-scheduled queue of the memory includes multiple memory access requests, the second memory access request is used to request to access a second sub-row in the memory, the first sub-row is located in a first subarray, and the second sub-row is located in a second subarray.

Step 1140: Generate a second activation instruction according to the second memory access request.

Step 1150: Send the obtained second activation instruction to the memory.

Both the first subarray and the second subarray include at least one row, any row in the at least one row includes at least one sub-row, any sub-row in the at least one sub-row includes at least one storage unit, and any storage unit is corresponding to one row number identifier and one column number identifier.

The second sub-row includes a storage unit whose column number identifier is the same as a column number identifier corresponding to a storage unit included in the first sub-row.

In this embodiment of the present disclosure, further, before the generating a first activation instruction according to the first memory access request, the following operation is further included: obtaining a third memory access request, where the third memory access request is used to request to access a third sub-row in the memory, the third sub-row and the first sub-row are located in a same row, and the second sub-row includes a storage unit whose column number identifier is the same as a column number identifier corresponding to a storage unit included in the third sub-row.

The generating a first activation instruction according to the first memory access request may be implemented in the following manner: combining the first memory access request and the third memory access request to generate the first activation instruction.

In this embodiment of the present disclosure, further, before the generating a second activation instruction according to the second memory access request, the following operation is further included:

obtaining a fourth memory access request, where the fourth memory access request is used to request to access a fourth sub-row in the memory, the fourth sub-row and the second sub-row are located in a same row, and the fourth sub-row includes a storage unit whose column number identifier is the same as the column number identifier corresponding to the storage unit included in the first sub-row.

The generating a second activation instruction according to the second memory access request may be: combining the second memory access request and the fourth memory access request to generate the second activation instruction.

In this embodiment of the present disclosure, optionally, the fourth sub-row includes a storage unit whose column number identifier is the same as the column number identifier corresponding to the storage unit included in the third sub-row.

In this solution, after a first latch activates a first sub-row, when a second sub-row includes a storage unit whose column number identifier is the same as a column number identifier corresponding to a storage unit included in the first sub-row, a second latch may also activate a second sub-row that is located in a different subarray from the first sub-row, so that resource utilization is improved.

Figure 12:
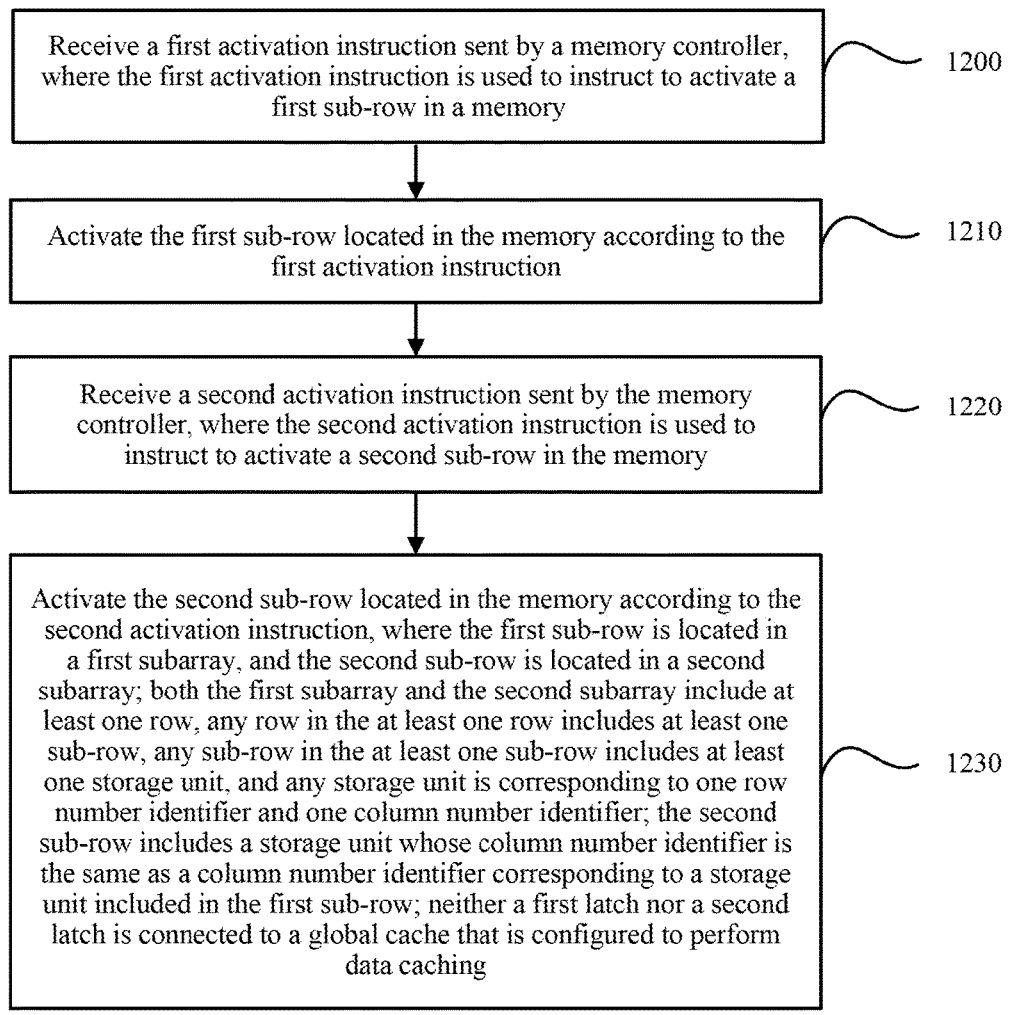
FIG. 12 is another flowchart of memory activation according to an embodiment of the present disclosure.

In an embodiment of the present disclosure, to improve resource utilization of a storage unit, as shown in FIG. 12, another memory activation method is provided:

Step 1200: Receive a first activation instruction sent by a memory controller, where the first activation instruction is used to instruct to activate a first sub-row in a memory.

Step 1210: Activate the first sub-row located in the memory according to the first activation instruction.

Step 1220: Receive a second activation instruction sent by the memory controller, where the second activation instruction is used to instruct to activate a second sub-row in the memory.

Step 1230: Activate the second sub-row located in the memory according to the second activation instruction.

The first sub-row is located in a first subarray, and the second sub-row is located in a second subarray.

Both the first subarray and the second subarray include at least one row, any row in the at least one row includes at least one sub-row, any sub-row in the at least one sub-row includes at least one storage unit, and any storage unit is corresponding to one row number identifier and one column number identifier.

The second sub-row includes a storage unit whose column number identifier is the same as a column number identifier corresponding to a storage unit included in the first sub-row.

Neither a first latch nor a second latch is connected to a global cache that is configured to perform data caching.

In this embodiment of the present disclosure, further, the first activation instruction is further used to instruct to activate a third sub-row in the memory, and the third sub-row and the first sub-row are located in a same row.

The second sub-row includes a storage unit whose column number identifier is the same as a column number identifier corresponding to a storage unit included in the third sub-row.

In this embodiment of the present disclosure, further, the second activation instruction is further used to instruct to activate a fourth sub-row in the memory, and the fourth sub-row and the second sub-row are located in a same row.

The fourth sub-row includes a storage unit whose column number identifier is the same as the column number identifier corresponding to the storage unit included in the first sub-row.

The fourth sub-row includes a storage unit whose column number identifier is the same as the column number identifier corresponding to the storage unit included in the third sub-row.

In this solution, after a first latch activates a first sub-row, when a second sub-row includes a storage unit whose column number identifier is the same as a column number identifier corresponding to a storage unit included in the first sub-row, a second latch may also activate a second sub-row that is located in a different subarray from the first sub-row, so that resource utilization is improved.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some embodiments of the present disclosure have been described, persons skilled in the art can make changes and modifications to these embodiments once they learn the basic inventive concept. Therefore, the following claims are intended to be construed as to cover the embodiments and all changes and modifications falling within the scope of the present disclosure.

Obviously, persons skilled in the art can make various modifications and variations to the embodiments of the present disclosure without departing from the spirit and scope of the embodiments of the present disclosure. The present disclosure is intended to cover these modifications and variations provided that they fall within the scope of protection defined by the following claims and their equivalent technologies.

What is claimed is:

1. A memory activation method, comprising:
  obtaining, by a request distribution module of a memory controller, a first memory access request for requesting access to a first sub-row in a memory and sending the first memory access request to a memory scheduler of the memory controller;
  receiving, by the memory scheduler, the first memory access request and searching, by the memory scheduler, a to-be-scheduled queue of the memory for a second memory access request, wherein the to-be-scheduled queue of the memory comprises multiple memory access requests, the second memory access request for requesting access to a second sub-row in the memory, and the first sub-row and the second sub-row are located in a same row in the memory;
  combining, by the memory scheduler, the first memory access request and the second memory access request to generate a first activation instruction for activating the first sub-row and the second sub-row in the memory and sending the first activation instruction to a command scheduler of the memory controller; and
  receiving, by the command scheduler, the first activation instruction and sending, by the command scheduler, the first activation instruction to the memory.

2. The method according to claim 1, wherein after searching, by the memory scheduler, the to-be-scheduled queue of the memory for a second memory access request, the method further comprises:
  generating, by the memory scheduler, a sub-row selection vector, and sending, by the memory controller, the sub-row selection vector to the memory, wherein the sub-row selection vector is used to identify that sub-rows to be activated are the first sub-row and the second sub-row.

3. A memory controller, comprising:
  a request distribution module;
  a memory scheduler;
  a command scheduler;
  a processor;
  and
  a non-transitory computer-readable storage medium coupled to the processor and storing programming instructions for execution by the processor, the programming instructions when executed by the processor, cause the processor to:
  configure the request distribution module to obtain a first memory access request for requesting access to a first sub-row in a memory and to send the first memory access request to the memory scheduler, configure the memory scheduler to receive the first memory access request from the request distribution module and to search a to-be-scheduled queue of the memory for a second memory access request, wherein the to-be-scheduled queue of the memory comprises multiple memory access requests, the second memory access request for requesting access to a second sub-row in the memory, and the first sub-row and the second sub-row are located in a same row in the memory, further configure the memory scheduler to combine the first memory access request and the second memory access request to generate a first activation instruction for activating the first sub-row and the second sub-row in the memory and send the first activation instruction to the command scheduler, and configure the command scheduler to receive the first activation instruction from the memory scheduler and to send the first activation instruction to the memory.

4. The memory controller according to claim 3, wherein the programming instructions when executed by the processor, further cause the processor to:

configure the memory scheduler to generate a sub-row selection vector, and configure the memory controller to send the sub-row selection vector to the memory, wherein the sub-row selection vector is used to identify that sub-rows to be activated are the first sub-row and the second sub-row.

5. A memory controller, comprising:
a request distribution module;
a memory scheduler;
a command scheduler;
a processor;
a non-transitory computer-readable storage medium coupled to the processor and storing programming instructions for execution by the processor, the programming instructions when executed by the processor, cause the processor to:

configure the request distribution module to obtain a first memory access request for requesting access to a first sub-row in a memory and to send the first memory access request to the memory scheduler, configure the memory scheduler to receive the first memory access request from the request distribution module and to generate a first activation instruction according to the first memory access request, and send the first activation instruction to the command scheduler, configure the command scheduler to send the first activation instruction obtained from the memory scheduler to the memory, further configure the memory scheduler to search a to-be-scheduled queue of the memory for a second memory access request, wherein the to-be-scheduled queue of the memory comprises multiple memory access requests, the second memory access request for requesting access to a second sub-row in the memory, the first sub-row is located in a first subarray, and the second sub-row is located in a second subarray, and further configure the memory scheduler to generate a second activation instruction according to the second memory access request, and send the second activation instruction to the command scheduler, configure the command scheduler to send the second activation instruction obtained from the memory scheduler to the memory;

wherein both the first subarray and the second subarray comprise at least one row, any row in the at least one row comprises at least one sub-row, any sub-row in the at least one sub-row comprises at least one storage unit, and any storage unit is corresponding to one row number identifier and one column number identifier; and wherein a column number identifier corresponding to any storage unit comprised in the second sub-row is different from a column number identifier corresponding to any storage unit comprised in the first sub-row.

6. The memory controller according to claim 5, wherein the programming instructions when executed by the processor, further cause the processor to:

configure the request distribution module to obtain a third memory access request for requesting access to a third sub-row in the memory, the third sub-row and the first sub-row are located in a same row, and a column number identifier corresponding to any storage unit comprised in the second sub-row is different from a column number identifier corresponding to any storage unit comprised in the third sub-row and send the third memory access request to the memory scheduler; and configure the memory scheduler to receive the third memory access request from the request distribution module and to combine the first memory access request and the third memory access request to generate the first activation instruction.

7. The memory controller according to claim 6, wherein the programming instructions when executed by the processor, further cause the processor to:

configure the request distribution module to obtain a fourth memory access request for requesting access to a fourth sub-row in the memory, the fourth sub-row and the second sub-row are located in a same row, and a column number identifier corresponding to any storage unit comprised in the fourth sub-row is different from a column number identifier corresponding to any storage unit comprised in the first sub-row and send the fourth memory access request to the memory scheduler; and configure the memory scheduler to receive the fourth memory access request from the request distribution module and to combine the second memory access request and the fourth memory access request to generate the second activation instruction.

8. The memory controller according to claim 7, wherein a column number identifier corresponding to any storage unit comprised in the fourth sub-row is different from a column number identifier corresponding to any storage unit comprised in the third sub-row.

9. A memory module, comprising:
a first latch, configured to receive a first activation instruction sent by a memory controller, wherein the first activation instruction is used to instruct to activate a first sub-row in a first subarray of a memory;
a first sub-row selection decoder, configured to activate the first sub-row located in the memory according to the first activation instruction;
a second latch, configured to receive a second activation instruction sent by the memory controller, wherein the second activation instruction is used to instruct to activate a second sub-row in a second subarray of the memory;

a second sub-row selection decoder, configured to activate the second sub-row located in the memory according to the second activation instruction;

wherein both the first subarray and the second subarray comprise at least one row, any row in the at least one row comprises at least one sub-row, any sub-row in the at least one sub-row comprises at least one storage unit, and any storage unit is corresponding to one row number identifier and one column number identifier;

wherein a column number identifier corresponding to any storage unit comprised in the second sub-row is different from a column number identifier corresponding to any storage unit comprised in the first sub-row; and wherein both the first latch and the second latch are connected to a global cache configured to perform data caching.

10. The memory module according to claim 9, wherein:

the first activation instruction is further used to instruct to activate a third sub-row in the memory, and the third sub-row and the first sub-row are located in a same row; and a column number identifier corresponding to any storage unit comprised in the second sub-row is different from a column number identifier corresponding to any storage unit comprised in the third sub-row.

11. The memory module according to claim 9, wherein:

the second activation instruction is further used to instruct to activate a fourth sub-row in the memory, and the fourth sub-row and the second sub-row are located in a same row;

a column number identifier corresponding to any storage unit comprised in the fourth sub-row is different from a column number identifier corresponding to any storage unit comprised in the first sub-row; and a column number identifier corresponding to any storage unit comprised in the fourth sub-row is different from a column number identifier corresponding to any storage unit comprised in the third sub-row.

* * * * *